(12) United States Patent
Watakabe et al.

(10) Patent No.: US 11,557,458 B2
(45) Date of Patent: Jan. 17, 2023

(54) CHARGED PARTICLE BEAM APPARATUS AND SETTING ASSISTING METHOD

(71) Applicant: JEOL Ltd., Tokyo (JP)

(72) Inventors: Kazutaka Watakabe, Tokyo (JP); Hirofumi Kuwahara, Tokyo (JP); Takenori Miyahara, Tokyo (JP); Takahide Sakata, Tokyo (JP); Felix Timischl, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 17/380,095

(22) Filed: Jul. 20, 2021

(65) Prior Publication Data
US 2022/0028653 A1 Jan. 27, 2022

(30) Foreign Application Priority Data
Jul. 21, 2020 (JP) .............................. JP2020-124582

(51) Int. Cl.
*H01J 37/28* (2006.01)
*H01J 37/22* (2006.01)
*H01J 37/244* (2006.01)

(52) U.S. Cl.
CPC ............ *H01J 37/28* (2013.01); *H01J 37/222* (2013.01); *H01J 37/244* (2013.01); *H01J 2237/20207* (2013.01); *H01J 2237/24475* (2013.01); *H01J 2237/24564* (2013.01); *H01J 2237/2807* (2013.01)

(58) Field of Classification Search
CPC .. H01J 37/00; H01J 37/02; H01J 37/26; H01J 37/226; H01J 37/256; H01J 37/265; H01J 37/28; H01J 37/222; H01J 37/244; H01J 2237/2485; H01J 2237/20207;
(Continued)

(56) References Cited

U.S. PATENT DOCUMENTS

2003/0193024 A1* 10/2003 Takagi .................. H01J 37/026
250/307
2004/0000639 A1* 1/2004 Storz .................. G02B 21/0076
250/310
(Continued)

FOREIGN PATENT DOCUMENTS

JP 02031146 A 2/1990
JP 200239976 A 2/2002
(Continued)

OTHER PUBLICATIONS

Extended European Search Report issued in EP21186404.6 dated Jan. 4, 2022.
(Continued)

*Primary Examiner* — Jason L McCormack
(74) *Attorney, Agent, or Firm* — The Webb Law Firm

(57) ABSTRACT

A reference image is generated based on an illumination condition and element information of a specimen. The reference image includes a figure indicating a characteristic X-ray generation range, a numerical value indicating a characteristic X-ray generation depth, or the like. The reference image changes with a change of an accelerating voltage, a tilt angle, or an element forming the specimen. The reference image may include a figure indicating a landing electron scattering range, a figure indicating a backscattered electron generation range, or the like.

11 Claims, 18 Drawing Sheets

(58) Field of Classification Search
CPC ... H01J 2237/24475; H01J 2237/24564; H01J 2237/2807; G01N 23/225; G01N 23/2251
USPC .......................................... 250/306, 307, 311
See application file for complete search history.

(56) References Cited

U.S. PATENT DOCUMENTS

| | | | |
|---|---|---|---|
| 2004/0126909 A1 | 7/2004 | Obara et al. | |
| 2008/0251719 A1 | 10/2008 | Nakahira et al. | |
| 2017/0309448 A1* | 10/2017 | Boughorbel | G01N 23/225 |
| 2020/0321189 A1* | 10/2020 | Yokosuka | H01J 37/28 |

FOREIGN PATENT DOCUMENTS

| | | |
|---|---|---|
| JP | 200262270 A | 2/2002 |
| JP | 2003240738 A | 8/2003 |
| JP | 2004163135 A | 6/2004 |
| JP | 2004191187 A | 7/2004 |
| JP | 2006275756 A | 10/2006 |
| JP | 2008177064 A | 7/2008 |

OTHER PUBLICATIONS

Zhao and Darwin, Quantitative Backscattered Electron Analysis Techniques for Cement-Based Materials, A report on research sponsored by The Air Force Office of Scientific Research, The University of Kansas, Jun. 1990, pp. 1-57.

Lee et al., Studies on Electron Penetration Versus Beam Acceleration Voltage in Energy-Dispersive X-Ray Microanalysis, ICSE, 2006, pp. 610-613.

Frank Krumeich, Properties of Electrons, their Interactions with Matter and Applications in Electron Microscopy, Laboratory of Inorganiz Chemistry, ETH Zurich, 2015, pp. 1-24.

Brooks and McGill, The Application of Scanning Electron Microscopy to Fractography, Materials Characterization, 1995, vol. 33, pp. 195-243.

Office Action issued in JP2020124582 dated Jun. 14, 2022.

* cited by examiner

| ELEMENT | ATOMIC NUMBER (Z) | MASS (A) | DENSITY (ρ) | MINIMUM EXCITATION ENERGY (Ec) | ... |
|---------|-------------------|----------|-------------|-------------------------------|-----|
| **** | **** | **** | **** | **** | ... |
| **** | **** | **** | **** | **** | ... |
| **** | **** | **** | **** | **** | ... |
| . . . | . . . | . . . | . . . | . . . | . . . |

FIG. 3

CHARGED PARTICLE BEAM APPARATUS AND SETTING ASSISTING METHOD

CROSS REFERENCE TO RELATED APPLICATION

This application claims priority to Japanese Patent Application No. 2020-124582 filed Jul. 21, 2020, the disclosure of which is hereby incorporated by reference in its entirety.

BACKGROUND OF THE INVENTION

Field of the Invention

The present disclosure relates to a charged particle beam apparatus and a method of assisting setting, and in particular to a technique to assist setting of an illumination condition.

Description of Related Art

As charged particle beam apparatuses, there are known a scanning electron microscope, an electron beam microanalyzer, an ion beam illumination apparatus, and the like. In the following, a scanning electron microscope will be described as a representative apparatus of these charged particle beam apparatuses.

A scanning electron microscope is an apparatus in which an electron beam which is a charged particle beam is illuminated onto a specimen, and secondary electrons, back-scattered electrons, characteristic X-rays, or the like emitted from the specimen are detected. An image representing a surface or a surface layer of the specimen is formed based on a sequence of detection signals acquired by two-dimensional scanning of the electron beam. With an analysis of the characteristic X-rays emitted from the specimen, a qualitative analysis and a quantitative analysis of the specimen are executed.

In a measurement of the specimen by the scanning electron microscope, an electron penetration depth (an electron beam penetration depth, an electron scattering depth) in the specimen changes depending on an element forming the specimen, and the electron penetration depth in the specimen also changes depending on an accelerating voltage (landing voltage) of the electron beam. Similarly, a depth in the specimen at which the back-scattered electrons are generated (a generation range of back-scattered electrons emitted from the specimen), and a depth in the specimen at which the characteristic X-rays are generated (a generation range of the characteristic X-rays emitted from the specimen) change depending on the element forming the specimen and the accelerating voltage of the electron beam.

In the scanning electron microscope, an illumination condition such as the accelerating voltage is set by designation of a numerical value by a user. In the related art, during setting of the illumination condition, there is no display of a schematic diagram or the like for assisting a setting operation. There is also known a simulation apparatus which estimates an electron scattering range or a signal generation range in the specimen. However, such an apparatus is not a measurement apparatus, and functions as a single entity, and there has been no cooperation between such an apparatus and the charged particle beam apparatus.

JP 2004-163135 A and JP 2006-275756 A disclose X-ray analysis apparatuses. These patent documents disclose calculation of an X-ray generation region in the specimen, and determination of the accelerating voltage based on the X-ray generation region. However, these patent documents do not disclose a technique for assisting the setting of the illumination condition by the user. In the present disclosure, the concept of the setting of the illumination condition may include processes to check and change the illumination condition.

An advantage of the present disclosure lies in assisting the setting of the illumination condition by the user in the charged particle beam apparatus. Alternatively, an advantage of the present disclosure lies in enabling setting of the illumination condition while the user imagines a range and a size of a physical phenomenon which occurs in the specimen, in the charged particle beam apparatus.

SUMMARY OF THE INVENTION

According to one aspect of the present disclosure, there is provided a charged particle beam apparatus comprising: a measurement unit that illuminates a charged particle beam onto a specimen, and that detects a signal emitted from the specimen; a reference image generator that generates a reference image including a figure simulating a signal generation range in the specimen and a numerical value indicating a size of the signal generation range, based on an illumination condition and specimen information for the generation of the reference image; and a display that displays a graphical user interface image including the reference image when an actual illumination condition of the charged particle beam is set.

According to another aspect of the present disclosure, there is provided a method of assisting setting, the method comprising: generating a reference image including a figure simulating a range of a physical phenomenon in a specimen onto which an electron beam is illuminated and a numerical value indicating a size of the range of the physical phenomenon, based on an illumination condition and specimen information for the generation of the reference image; and displaying the reference image when a user sets an actual illumination condition of the electron beam.

BRIEF DESCRIPTION OF THE DRAWINGS

Embodiment(s) of the present disclosure will be described based on the following figures, wherein:

FIG. 3 is a diagram showing an example of an element table;

DESCRIPTION OF THE INVENTION

Figure 1:
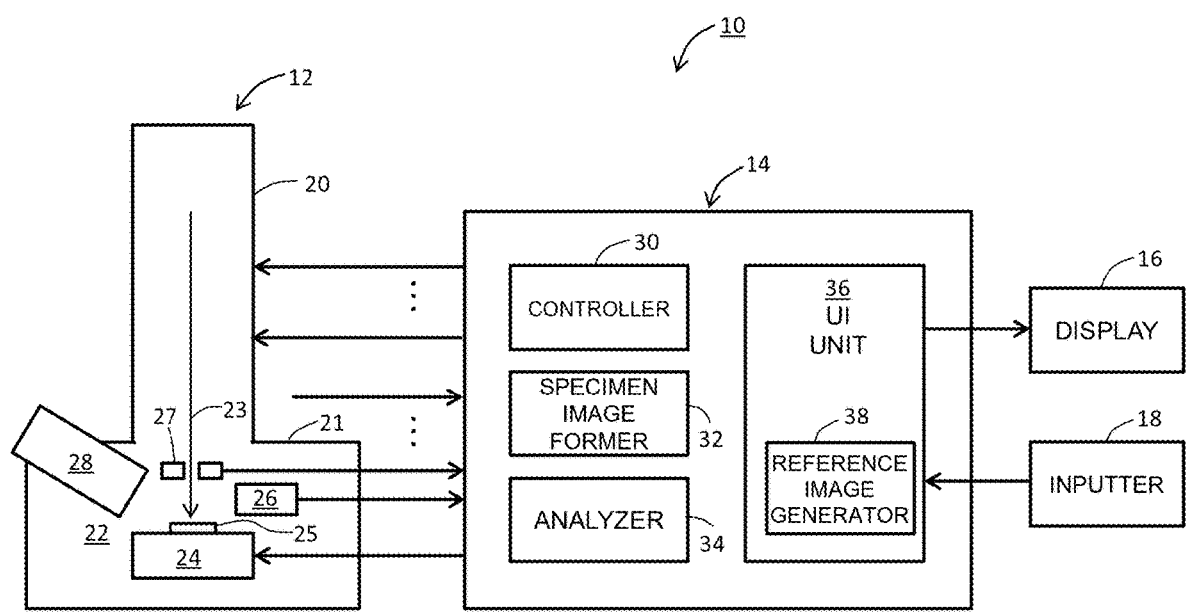
FIG. 1 is a conceptual diagram showing a scanning electron microscope according to an embodiment of the present disclosure.

An embodiment of the present disclosure will now be described with reference to the drawings.

(1) Overview of Embodiment

A charged particle beam apparatus according to an embodiment of the present disclosure comprises a measurement unit, a reference image generator, and a display. The measurement unit illuminates a charged particle beam onto a specimen, and detects a signal emitted from the specimen. The reference image generator generates a reference image including a figure simulating a signal generation range in the specimen and a numerical value indicating a size of the signal generation range, based on an illumination condition and specimen information for the generation of the reference image. The display displays a graphical user interface image including the reference image when an actual illumination condition of the charged particle beam is set.

According to the above-described configuration, it becomes possible for a user to set the actual illumination condition while imagining or recognizing an extent of the signal generation range in the specimen through observation of the reference image in the graphical user interface image. With this process, even a user who has only poor knowledge of the charged particle beam or the charged particle beam apparatus can appropriately set the actual illumination condition.

In an embodiment of the present disclosure, the charged particle beam is an electron beam, and the measurement unit includes an electron beam source, a detector, or the like. As the detector, there may be exemplified a secondary electron detector, a back-scattered electron detector, a characteristic X-ray detector, or the like. The concept of the illumination condition includes an accelerating voltage, and also a specimen inclination angle. The specimen information is element information for an element forming the specimen, and, in particular, is physical information which affects an electron scattering range and the signal generation range in the specimen. The signal generation range is, for example, a generation range of the characteristic X-rays, a generation range of back-scattered electrons, or the like. Alternatively, there may be generated a reference image which includes a plurality of figures indicating a plurality of signal generation ranges, and a plurality of numerical values indicating the sizes of the plurality of signal generation ranges. Alternatively, the reference image may include a figure indicating an electron scattering range and a numerical value indicating a size of the electron scattering range.

In an embodiment of the present disclosure, a size of the figure is maintained regardless of a change of the actual size of the signal generation range, but alternatively, the size of the figure may be changed according to the change of the actual size of the signal generation range. Even when the size of the figure is constant, the user can recognize the size of the signal generation range by a change of the numerical value accompanying the figure. In an embodiment of the present disclosure, a shape of the signal generation range in the specimen may be approximately recognized through an outer shape of the figure. However, the shape of the figure and the numerical value are merely rough estimates. Even when these information are rough estimates, the setting of the illumination condition by the user can be assisted, in comparison to the case in which no information is provided.

A charged particle beam apparatus according to an embodiment of the present disclosure further comprises an acquisition unit, and a receiver. The acquisition unit acquires, as the illumination condition for the generation of the reference image, an illumination condition which is already set for the measurement unit. The receiver receives, as the illumination condition for the generation of the reference image, an illumination condition which is input through the graphical user interface image. The concept of the illumination condition already set in the measurement unit includes an illumination condition which is recognized and managed by a controller which controls the measurement unit.

A charged particle beam apparatus according to an embodiment of the present disclosure further comprises an application unit. The application unit applies, to the measurement unit, as the illumination condition for the generation of the reference image, an illumination condition which is input through the graphical user interface image. Here, "application" means activation, change from a provisional setting to a non-provisional setting, etc.

In an embodiment of the present disclosure, the reference image changes with a change of the illumination condition for the generation of the reference image. A validity of the illumination condition after the change can be evaluated by referring to the reference image after the change, and the user can thus narrow the illumination condition to an appropriate illumination condition through such a process.

In an embodiment of the present disclosure, the illumination condition for the generation of the reference image includes an accelerating voltage. The reference image changes with a change of the accelerating voltage. In an embodiment of the present disclosure, the illumination condition for the generation of the reference image includes a specimen inclination angle. The reference image changes with a change of the specimen inclination angle. In an embodiment of the present disclosure, the specimen information for the generation of the reference image is element information. The reference image changes with a change of the element information. In an embodiment of the present disclosure, the charged particle beam is an electron beam. The reference image includes the figure simulating a characteristic X-ray generation range as the signal generation range, and the numerical value indicating a size of the characteristic X-ray generation range. In an embodiment of the present disclosure, the reference image includes the figure simulating a back-scattered electron generation range as the signal generation range, and the numerical value indicating a size of the back-scattered electron generation range. In an embodiment of the present disclosure, the reference image includes a figure simulating an electron scattering range in the specimen, and a numerical value indicating a size of the electron scattering range. In an embodiment of the present disclosure, the reference image includes a numerical value indicating the illumination condition for the generation of the reference image. The numerical value indicating the illumination condition for the generation of the reference image changes with a change of the numerical value indicating the size of the signal generation range.

A method of assisting according to an embodiment of the present disclosure comprises a first step and a second step. In the first step, a reference image is generated based on an illumination condition and specimen information for the generation of the reference image, which includes a figure simulating a range of a physical phenomenon in a specimen onto which an electron beam is illuminated and a numerical value indicating a size of the range of the physical phenomenon. In the second step, the reference image is displayed when a user sets an actual illumination condition of the electron beam.

In an embodiment of the present disclosure, after the second step, an illumination condition for the generation of the reference image, which is input by the user through a graphical user interface image including the reference image, is received. Then, through a certain operation or input, the received illumination condition is set as a formal illumination condition for a measurement unit.

The method of assisting the setting may be realized by a function of software. In this case, a program executing the method of assisting setting is installed via a network or a transportable recording medium in a charged particle beam apparatus, an information processor, or the like.

(2) Details of Embodiment

FIG. 1 shows a charged particle beam apparatus according to an embodiment of the present disclosure. The charged particle beam apparatus is specifically a scanning electron microscope 10. In the illustrated example configuration, the scanning electron microscope 10 may primarily be separated into a measurement unit 12 and an information processor 14. The information processor 14 is formed from, for example, a personal computer (PC). A display 16 and an inputter 18 are connected to the information processor 14.

The measurement unit 12 comprises a lens barrel 20 and a body 21. An inside of the body 21 is a specimen chamber 22. In the lens barrel 20, an electron beam source, a focusing lens, a deflection scanning lens, an objective lens, or the like is provided. An electron beam 23 is generated by these constituting elements. In the specimen chamber 22, a specimen stage 24 is provided, and a specimen 25 is held by the specimen stage 24. Specifically, a specimen holder holding the specimen 25 is attached to the specimen stage 24. The specimen stage 24 has an XYZ mechanism which moves the specimen 25 in up-and-down and left-and-right directions, a rotational mechanism which rotates the specimen 25, and a tilt mechanism which inclines the specimen 25. A specimen inclination angle is also called a tilt angle. The specimen 25 has a form of, for example, a small piece, a circular disc, or the like. Alternatively, a specimen 25 having a different form may be set as a measurement target.

In the illustrated example structure, a secondary electron detector 26, a back-scattered electron detector 27, and a characteristic X-ray spectrometer 28 are provided at a periphery of the specimen 25. These constituting elements are schematically represented. When the electron beam 23 is illuminated onto the specimen 25, secondary electrons and back-scattered electrons are emitted from the specimen 25, and a characteristic X-ray is emitted from the specimen 25. With the secondary electron detector 26, the secondary electrons emitted from the specimen 25 are detected. With the back-scattered electron detector 27, the back-scattered electrons emitted from the specimen 25 are detected. With the characteristic X-ray spectrometer 28, the characteristic X-ray emitted from the specimen 25 is detected.

The characteristic X-ray spectrometer 28 is, for example, an energy-dispersive characteristic X-ray spectrometer. In place of or in addition to the energy-dispersive characteristic X-ray spectrometer, a wavelength-dispersive characteristic X-ray spectrometer may be provided. Alternatively, a detector other than those described above may be provided. Normally, the electron beam 23 is two-dimensionally scanned with respect to the specimen 25. A plurality of detection signals which are output from the secondary electron detector 26, the back-scattered electron detector 27, and the characteristic X-ray spectrometer 28 are sent to the information processor 14.

The information processor 14 includes a processor which executes an information process, a memory which stores data and a program, or the like. In FIG. 1, a plurality of representative functions realized by the information processor 14 are represented by a plurality of blocks. Specifically, the information processor 14 functions as a controller 30, a specimen image former 32, an analyzer 34, a UI (user interface) unit 36, or the like.

The controller 30 controls operations of various devices in the measurement unit 12. With the controller 30, a plurality of operation parameters for realizing an illumination condition designated by the user are determined. The illumination condition includes an accelerating voltage of the electron beam 23, a tilt angle of the specimen 25, or the like. The accelerating voltage of the electron beam 23 may also be called a landing voltage of the electron beam 23, from the viewpoint of the specimen 25.

The specimen image former 32 forms a two-dimensional image representing a surface or a surface layer of the specimen 25 based on a sequence of detection signals (for example, a sequence of secondary electron detection signals or a sequence of back-scattered electron detection signals) acquired by the two-dimensional scanning of the electron beam 23. The analyzer 34 executes a qualitative analysis and a quantitative analysis of the specimen 25 based on the detection signal which is output from the characteristic X-ray spectrometer 28. The analyzer 34 in particular has a function to analyze one or a plurality of elements forming the specimen and a concentration (weight concentration) of each element.

The UI unit 36 generates a graphical user interface (GUI) image provided to the user, and receives information which is input by the user through the GUI image. The UI unit 36 has a reference image generator 38.

The reference image generator 38 is a module which generates a reference image. The reference image is an image including a figure simulating a signal generation range in the specimen and a size of the signal generation range. The reference image forms a relevant portion of the GUI image. The signal generation range is, for example, a characteristic X-ray generation range in the specimen, and is more particularly a range in which the characteristic X-ray emitted from the specimen is generated. The reference image may further include a figure showing another signal generation range, or a figure showing an electron penetration range (electron scattering range). The reference image is an image showing a cross section of the signal generation range. Alternatively, a reference image three-dimensionally representing the signal generation range may be generated.

The reference image or the GUI image including the reference image is a support image for assisting setting of the illumination condition by the user. The user can determine and input the illumination condition such as the accelerating voltage through the GUI image while imagining or recognizing, through observation of the GUI image, a shape and a size of the signal generation range. As described, the UI unit 36 functions as a calculating means, an image generation means, and a reception means.

In the example structure illustrated in FIG. 1, the information processor 14 has the UI unit 36, but alternatively, the UI unit 36 may be included in another information processor. For example, a first information processor including the controller 30, and a second information processor including the UI unit 36 may be provided, and these information processors may cooperate with each other.

The display 16 is formed from a liquid crystal display, an organic EL display device, or the like. The inputter 18 is formed from a keyboard, a pointing device, or the like. Alternatively, a display with a touch panel may be provided as the display 16 and the inputter 18.

Figure 2:
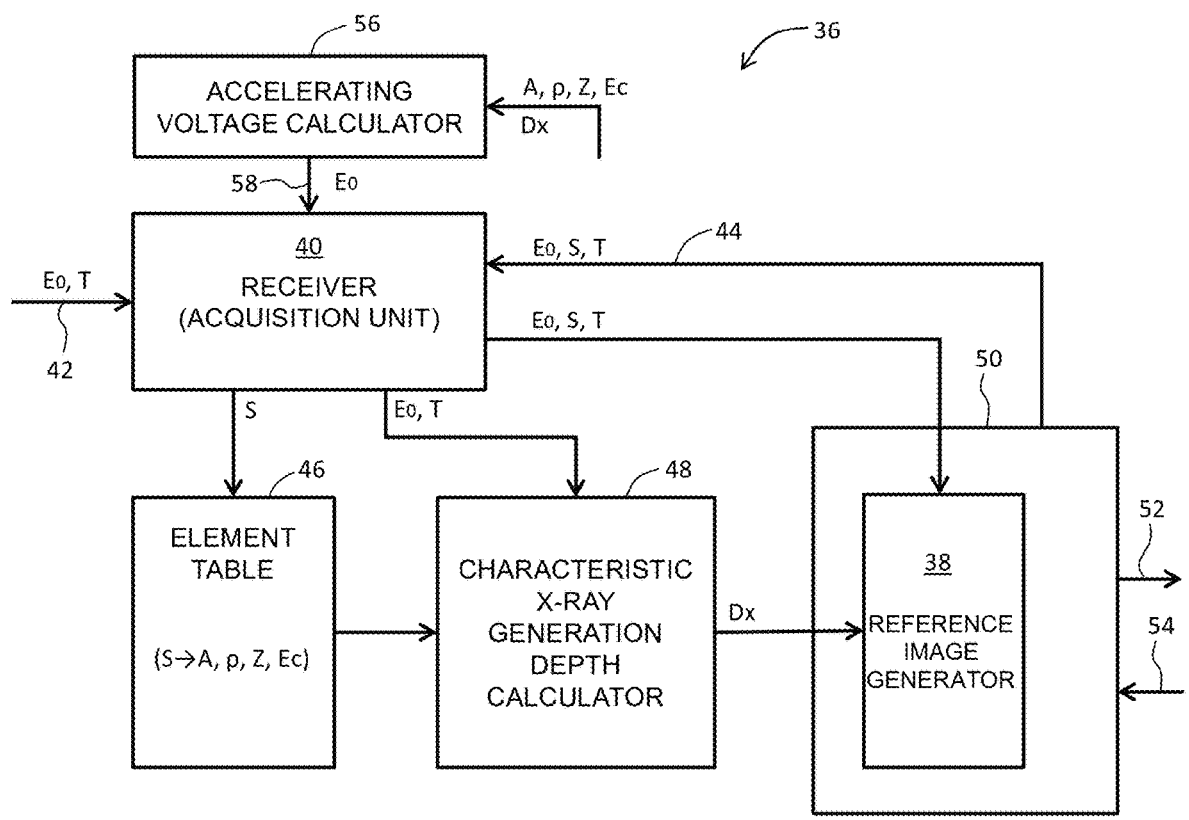
FIG. 2 is a diagram showing an UI (user interface) unit in a first configuration.

FIG. 2 shows a first configuration of the UI unit 36. A plurality of blocks shown in FIG. 2 correspond to a plurality of functions realized by software, except for an element table 46. A receiver 40 is a module which receives an accelerating voltage $E_0$, an element S, and a tilt angle T. The receiver 40 has default values for these parameters. A default value of the accelerating voltage $E_0$ is, for example, 5 kV. A default value of the element S is, for example, aluminum (Al). A default value of the tilt angle is, for example, 0°. These values are merely exemplary.

As shown by reference numeral 42, the receiver 40 acquires from the controller the accelerating voltage $E_0$ and the tilt angle T which are already set in the controller, in response to an operation of the user. That is, the receiver 40 functions as an acquisition unit. As shown by reference numerals 54 and 44, the receiver 40 has a function to receive the accelerating voltage $E_0$, the element S, or the tilt angle T which is input by the user through the GUI image. As the default value of the accelerating voltage $E_0$, an accelerating voltage which is set in the controller may be employed. In this case, the receiver 40 automatically acquires the accelerating voltage from the controller prior to generation of the reference image.

Information for specifying the element S, received by the receiver 40, is supplied to the element table 46. The element table 46 forms an element database. When the information for specifying the element S is supplied to the element table 46, element information corresponding to the element S is output from the element table 46. The element information includes a mass A, an atomic number Z, a density p, and a minimum excitation energy Ec. The minimum excitation energy differs depending on the element and an electron orbital. In the element table 46, a plurality of minimum excitation energies corresponding to a plurality of characteristic X-rays may be managed.

A characteristic X-ray generation depth calculator 48 calculates a characteristic X-ray generation depth $D_X$ based on the accelerating voltage $E_0$, the tilt angle T, and the element information. A calculation formula for this purpose will be described later. As will be described later, the characteristic X-ray generation depth $D_X$ is a depth from a specimen surface in a direction orthogonal to the specimen surface. Thus, even when the element S does not change and the accelerating voltage $E_0$ is a constant, the characteristic X-ray generation depth $D_X$ changes when the tilt angle T changes.

An image generator 50 is a module which generates the GUI image, and includes the reference image generator 38. To the reference image generator 38, the characteristic X-ray generation depth $D_X$, the accelerating voltage $E_0$, the element S, and the tilt angle T are supplied. The reference image includes a figure simulating the characteristic X-ray generation range, a numerical value indicating the characteristic X-ray generation depth $D_X$, a numerical value indicating the accelerating voltage $E_0$, a symbol indicating the element S, and a numerical value indicating the tilt angle T. The characteristic X-ray generation depth $D_X$ is a maximum value of the characteristic X-ray generation range in the depth direction.

In the present embodiment, a size of the figure simulating the characteristic X-ray generation range is constant regardless of the characteristic X-ray generation depth $D_X$. On the other hand, the numerical value indicating the characteristic X-ray generation depth $D_X$ changes according to the characteristic X-ray generation depth $D_X$. As will be described later, with a change of the tilt angle, a size of a cut portion in each figure (a portion to be masked) changes. Reference numeral 52 shows a signal which is output to the display. Reference numeral 54 shows a signal from the inputter.

An accelerating voltage calculator 56 is a module which back-calculates the accelerating voltage $E_0$ from the characteristic X-ray generation depth $D_X$ as necessary. For the back calculation, reference is made to the element information. The back-calculated accelerating voltage $E_0$ is sent through the receiver 40 to the reference image generator 38, and the reference image is updated. More specifically, the numerical value indicating the accelerating voltage $E_0$ is updated.

In the example structure illustrated in FIG. 2, the receiver 40 does not have an application function to activate the illumination condition for the generation of the reference image. Therefore, when the illumination condition such as the accelerating voltage is designated on the GUI image, it is still required to separately input, as an actual illumination condition, the designated illumination condition to the controller. This is a safety measure to make the user be more cautious in setting the illumination condition. In this case also, the GUI image is still an image for assisting the setting of the illumination condition. Alternatively, as will be described later, the application function may be added to the receiver, and the illumination condition designated through the GUI image may be directly applied to the controller.

Similar to the related art, processes to newly set the illumination condition, to check the illumination condition, and to change the illumination condition can be executed through the setting image (which does not have the reference image) for setting the illumination condition. Such a setting image is generated by the controller shown in FIG. 1. For example, users having abundant knowledge and experience for the electron beam or the scanning electron microscope may set the illumination condition on the setting image, without going through the display of the GUI image.

FIG. 3 shows an example structure of the element table. The element table 46 is constructed on a nonvolatile memory. The element table 46 has a plurality of records 60 corresponding to a plurality of elements. Each record 60 is formed from a plurality of pieces of information corresponding to an element 62. These information include an atomic number 64, a mass 66, a density (weight density) 68, a minimum excitation energy 70, or the like. As described above, a plurality of minimum excitation energies 70 may be registered corresponding to a plurality of characteristic X-rays.

Figure 4:
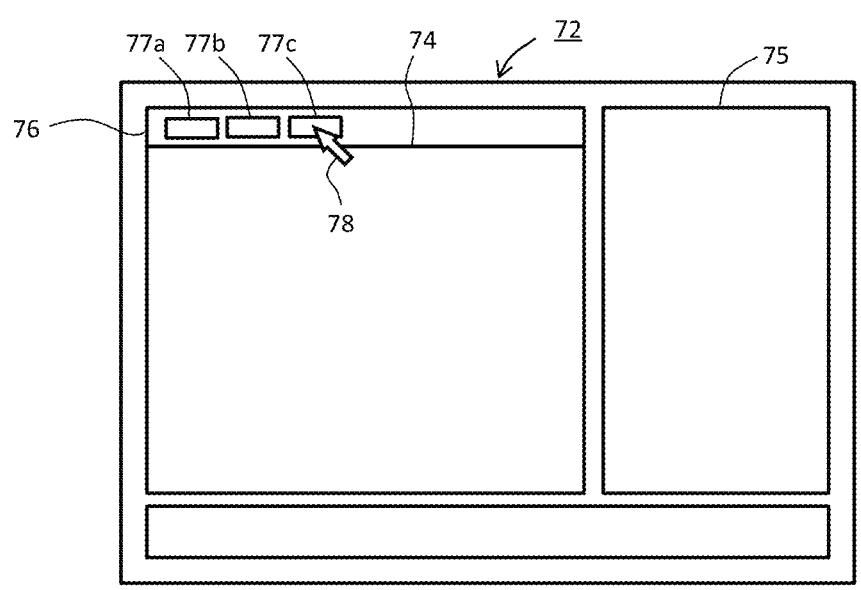
FIG. 4 is a diagram for explaining a display start operation.

FIG. 4 shows an operation executed when display of the GUI image is started. A screen 72 includes a plurality of windows 74 and 75. The window 74 is a main window, and a plurality of images are selectively displayed therein. These images include the setting image and the GUI image.

A menu bar 76 includes a plurality of buttons 77a, 77b, and 77c. For example, the button 77c is a button for stating up the display of the GUI image. When the button 77c is selected with a pointer 78, and a click operation is performed, the GUI image including the reference image is displayed in the window 74.

Figure 5:
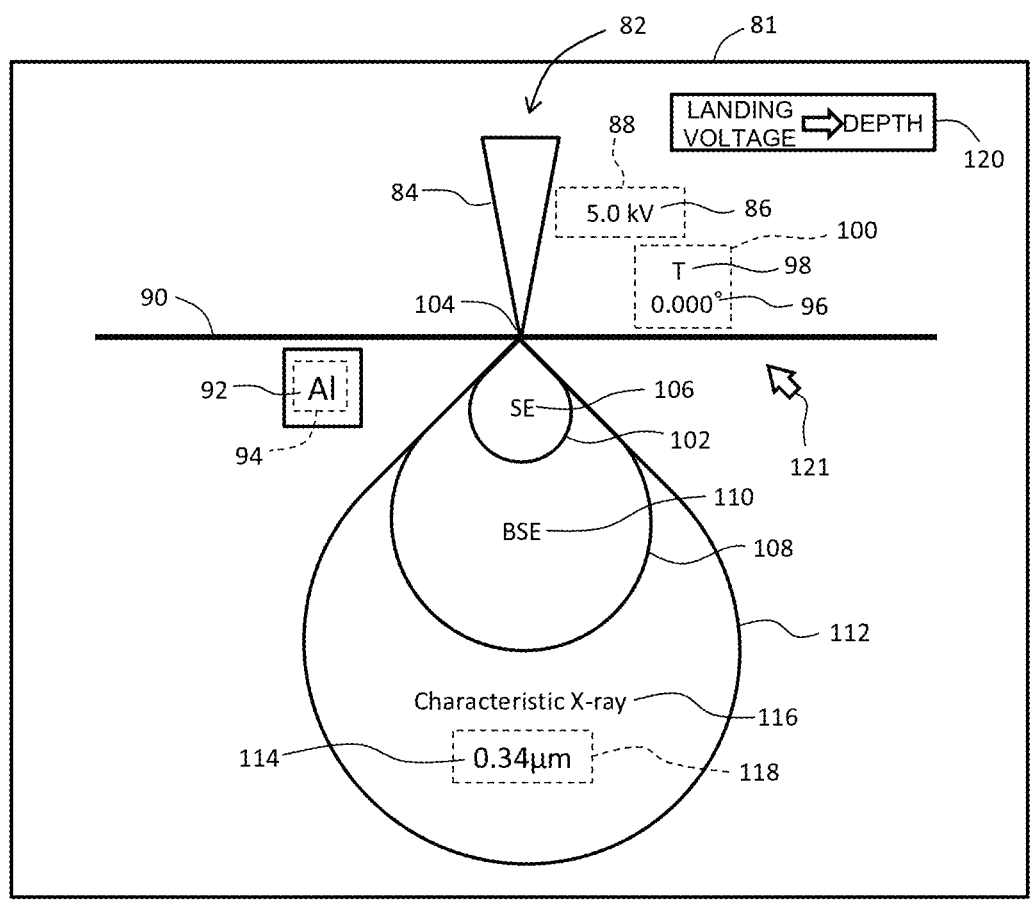
FIG. 5 is a diagram showing a reference image in the first configuration.

FIG. 5 shows a GUI image 81 of the first configuration. The GUI image 81 includes a reference image 82 of the first configuration. In the illustrated example, the GUI image 81 also includes a guidance display 120. The reference image 82 includes a plurality of figures or shapes 84, 90, 102, 108, and 112, a plurality of numerical values 86, 96, and 114, and a plurality of labels (test strings) 92, 98, 106, 110, and 116. The reference image 82 corresponds to a vertical cross section of the specimen (cross section including a trajectory of the electron beam).

The figure or shape 84 is a triangle, and more specifically has a downward-oriented pinnacle shape. The figure or shape 84 simulates the electron beam. The figure or shape 90 is a straight line simulating the specimen surface. Even when unevenness is present on the specimen surface in reality, the figure or shape 90 is shown as a straight line. A side lower than the figure or shape 90 corresponds to the inside of the specimen. An apex 104 of the figure or shape 84 comes in contact with the figure or shape 90. The apex 104 shows a point of illumination of the electron beam. The numerical value 86 indicates the accelerating voltage (landing voltage). Boxes 88, 94, 100, and 118 represented with broken lines indicate that the values inside the boxes are values that can be changed by the user. These boxes function as pointer recognition regions. The numerical value 96 indicates the tilt angle. As the tilt angle, an arbitrary numerical value within a range of 0° to 90° may be designated. This range is merely exemplary. The label 98 is a symbol showing the tilt angle.

The label 92 shows the element forming the specimen. Specifically, the label 92 is an element symbol. The element is designated by the user. When the specimen is formed from a plurality of elements, a primary element or a dominating element may be designated. Alternatively, a structure may be employed in which a plurality of elements can be designated simultaneously. For example, a periodic table may be displayed, and one or a plurality of elements may be selected from the periodic table.

The figure or shape 102 has a liquid drop shape, and an apex thereof coincides with the apex 104. The figure or shape 102 simulates the secondary electron generation range. The label (SE) 106 indicating the secondary electron is shown inside the figure or shape 102. A size of the figure or shape 102 is constant regardless of the accelerating voltage or the like. Alternatively, the size may be changed according to the accelerating voltage or the like. Two slanted sides in the liquid drop shape are slanted with respect to a horizontal axis with angles of +45° and −45°, respectively.

The figure or shape 108 has a liquid drop shape, and an apex thereof coincides with the apex 104. The figure or shape 108 simulates the back-scattered electron generation range. The label (BSE) 110 showing the back-scattered electron is displayed inside the figure or shape 108. A size of the figure or shape 108 is also constant regardless of the accelerating voltage or the like. Alternatively, the size may be changed according to the accelerating voltage or the like.

The figure or shape 112 has a liquid drop shape, and an apex thereof coincides with the apex 104. The figure or shape 112 simulates the characteristic X-ray generation range. The label (Characteristic X-ray) 116 showing the characteristic X-ray is displayed inside the figure or shape 112. A size of the figure or shape 112 is also constant regardless of the accelerating voltage or the like. Alternatively, the size may be changed according to the accelerating voltage or the like. Inside the figure or shape 112, the numerical value 114 indicating the characteristic X-ray generation depth (that is, $D_X$ described above) is displayed. The numerical value indicates a size (a maximum value in the depth direction) of the generation range of the characteristic X-ray emitted from the specimen. The numerical value 114 changes with a change of the accelerating voltage, with a change of the element, or with a change of the tilt angle. When a plurality of characteristic X-rays are generated, the generation depth is displayed for one of the characteristic X-rays. In the present embodiment, according to the accelerating voltage, a table for selecting a characteristic X-ray for which the generation depth is to be displayed, from among the plurality of characteristic X-rays, is prepared, and the generation depth to be displayed is selected according to the accelerating voltage by referring to this table. Alternatively, a plurality of generation depths may be displayed together.

The guidance display 120 shows that the characteristic X-ray generation depth is being calculated from the landing voltage; that is, the accelerating voltage. On the other hand, when the accelerating voltage is being calculated from the characteristic X-ray generation depth, a different guidance display to be described below is presented.

A paint process may be applied to the figures or shapes 102, 108, and 112. Alternatively, a configuration may be employed in which a display target figure can be arbitrarily selected from these figures. Alternatively, a configuration may be employed in which a display size of the reference image 82 can be adjusted. Alternatively, figures or shapes 102, 108, and 112, may be shapes other than the liquid drop shape such as, for example, a circular shape, an elliptical shape, a vase shape, or the like may be employed.

Figure 6:
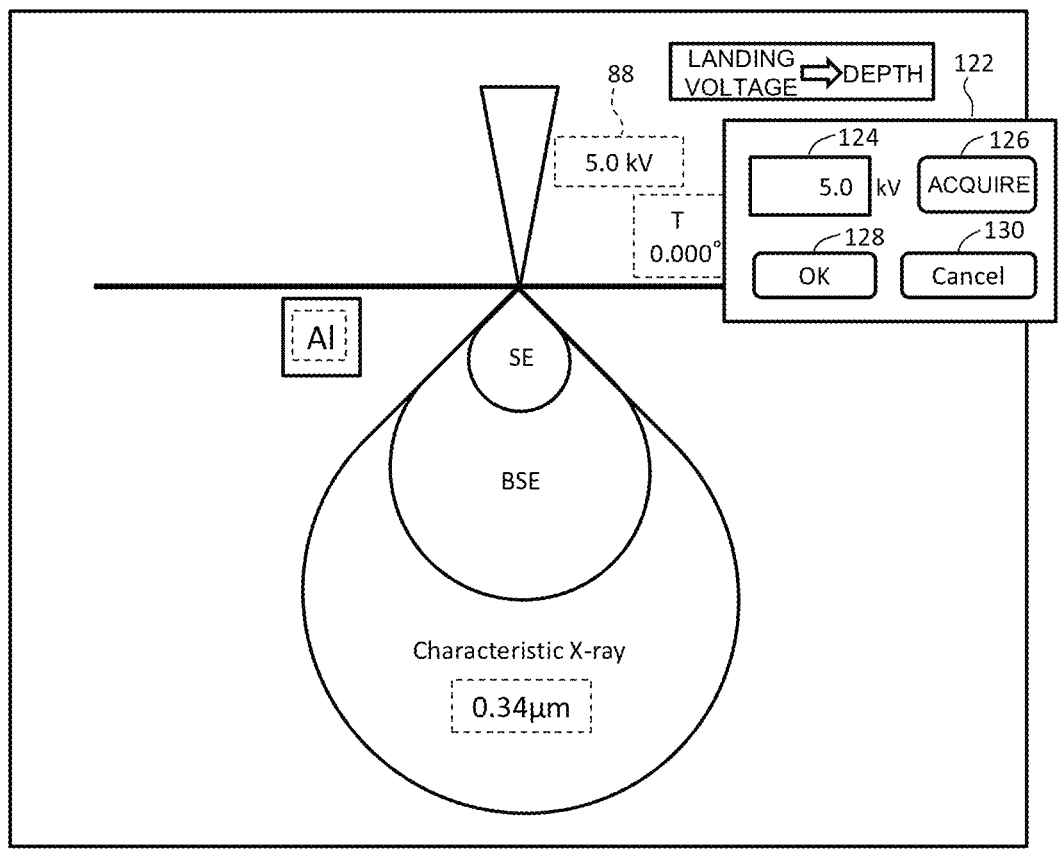
FIG. 6 is a diagram showing a pop-up window for setting an accelerating voltage.

In FIG. 5, when a pointer (cursor) 121 is moved close to the numerical value 86, more specifically, to a position in the box 88, and the click operation is performed, a window 122 shown in FIG. 6 is pop-up displayed.

In FIG. 6, the window 122 includes an input field 124 for the accelerating voltage, an acquisition button 126, an OK button 128, and a cancel button 130. The accelerating voltage can be directly input as a numerical value using the input field 124. When the acquisition button 126 is clicked, the accelerating voltage which is set in the controller is acquired, and is reflected in the input field 124. With clicking of the OK button 128, the window 122 is closed, and the accelerating voltage which is input in the input field 124 is reflected in the reference image. Specifically, the numerical value indicating the accelerating voltage is changed, and the numerical value indicating the characteristic X-ray generation depth is changed.

Figure 7:
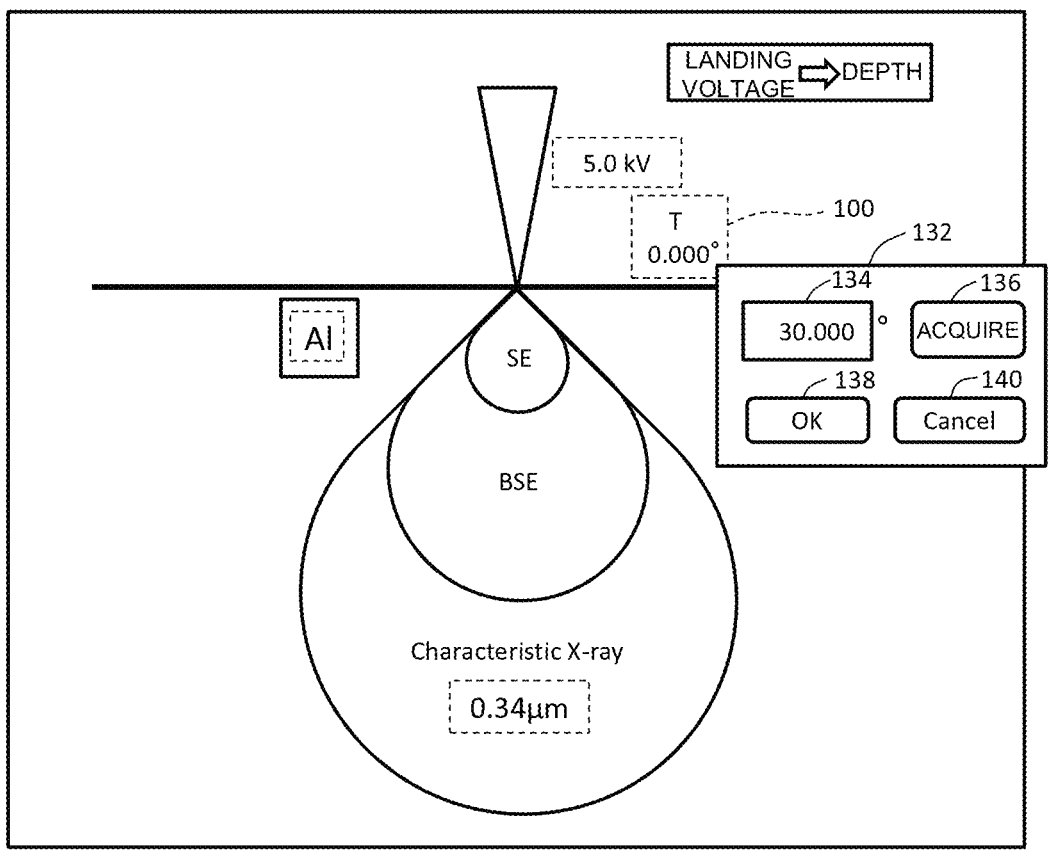
FIG. 7 is a diagram showing a pop-up window for setting a tilt angle.

In FIG. 5, when the pointer 121 is moved to a position inside the box 100 and the click operation is performed, a window 132 shown in FIG. 7 is pop-up displayed. The window 132 includes an input field 134 for the tilt angle, an acquisition button 136, an OK button 138, and a cancel button 140. The tilt angle can be directly input as a numerical value using the input field 134. When the acquisition button 136 is clicked, the tilt angle which is set in the controller is acquired and reflected in the input field 134. With clicking of the OK button 138, the window 132 is closed, and the tilt angle which is input in the input field 134 is reflected in the reference image. In this case, the form of the reference image changes, and the numerical value indicating the characteristic X-ray generation depth changes.

Figure 8:
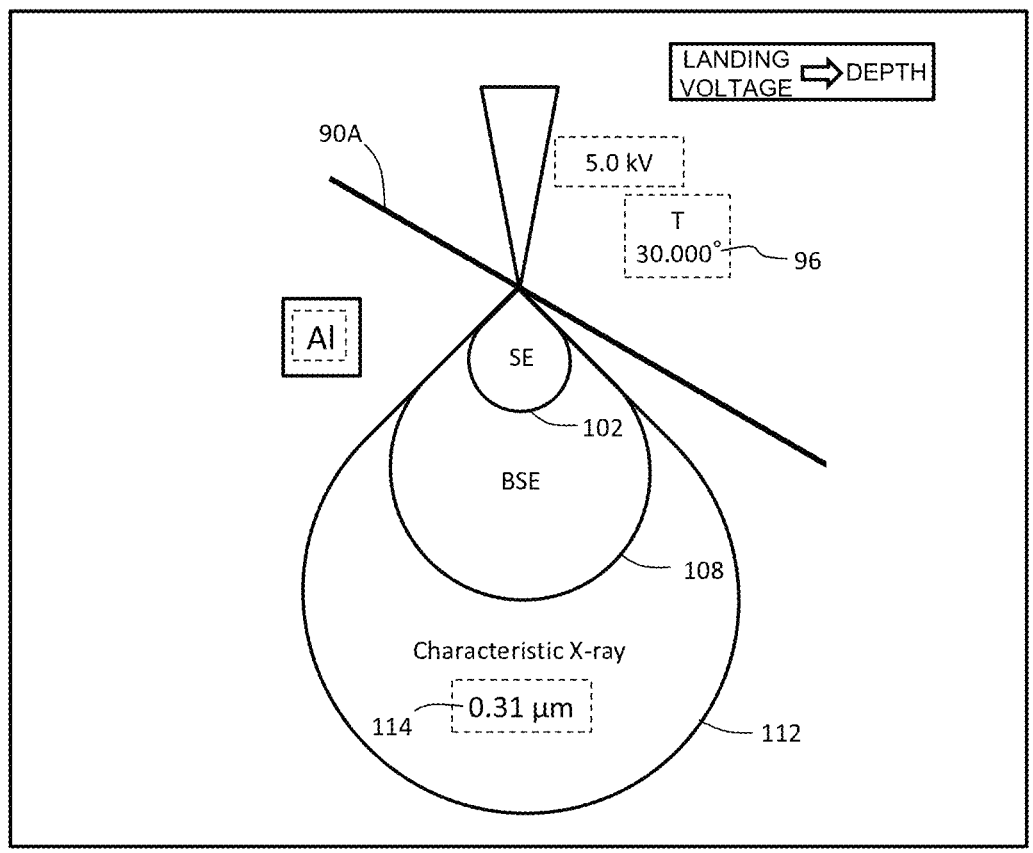
FIG. 8 is a diagram showing a reference image representing an inclined state.

FIG. 8 shows a reference image displayed when 30° is designated as the tilt angle. A value of "30.000°" is displayed as the numerical value 96. A straight line 90A showing the specimen surface is in an inclined state, with an inclination angle of 30°. An orientation and a position of the figure showing the electron beam are maintained. In the example display shown in FIG. 8, the mask region does not extend to the figures or shapes 102, 108, and 112, and the entirety of each of the figures or shapes 102, 108, and 112 is displayed. The numerical value 114 indicating the characteristic X-ray generation depth changes according to the tilt angle. A definition of the depth in the specimen inclined state will be described later in detail.

Figure 9:
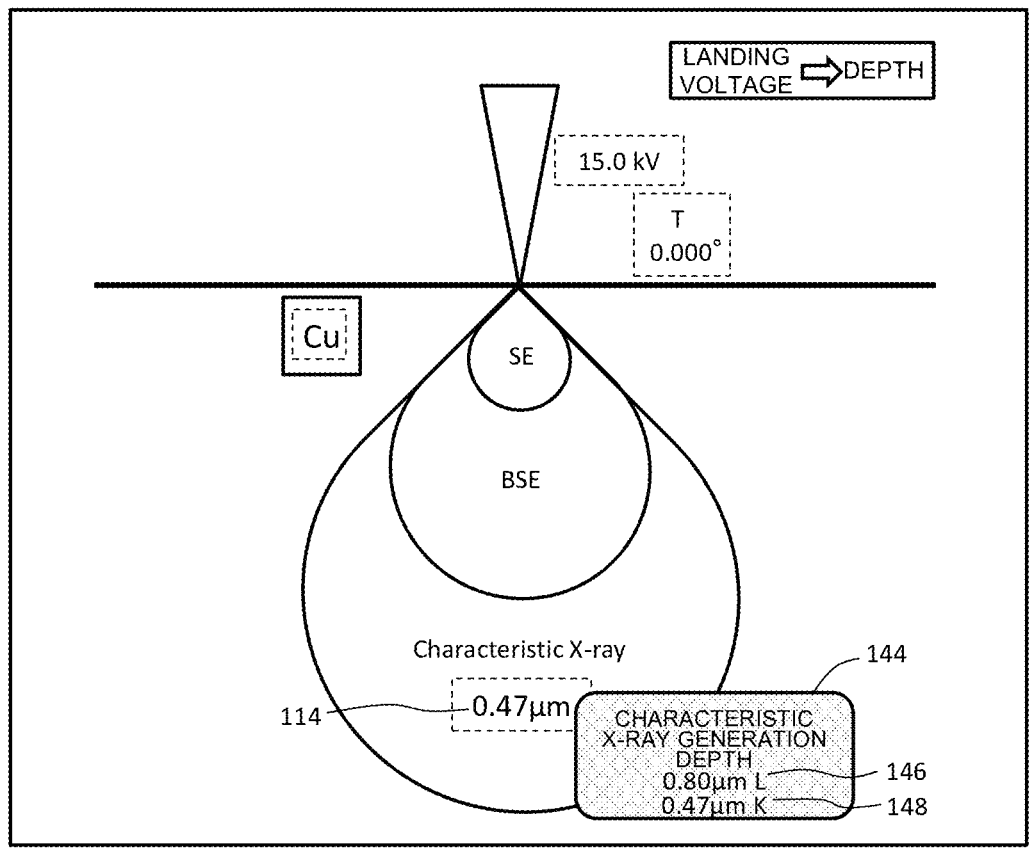
FIG. 9 is a diagram showing a pop-up window for displaying a characteristic X-ray generation depth.

In FIG. 5, when the pointer 121 is moved to a position inside the box 114 (no click operation is necessary), a window 144 shown in FIG. 9 is automatically pop-up displayed. In FIG. 9, the window 144 includes two numerical values 146 and 148 indicating the characteristic X-ray generation depths. The numerical value 146 indicates a generation depth of an L line, and the numerical value 148 indicates a generation depth of a K line. With this configuration, it becomes possible to recognize the generation depth of each characteristic X-ray when a plurality of the characteristic X-rays are generated. Although the reference image includes only one numerical value 114, alternatively, the reference image may include a plurality of numerical values indicating a plurality of generation depths. According to the present embodiment, the content of the reference image can be simplified.

Figure 10:
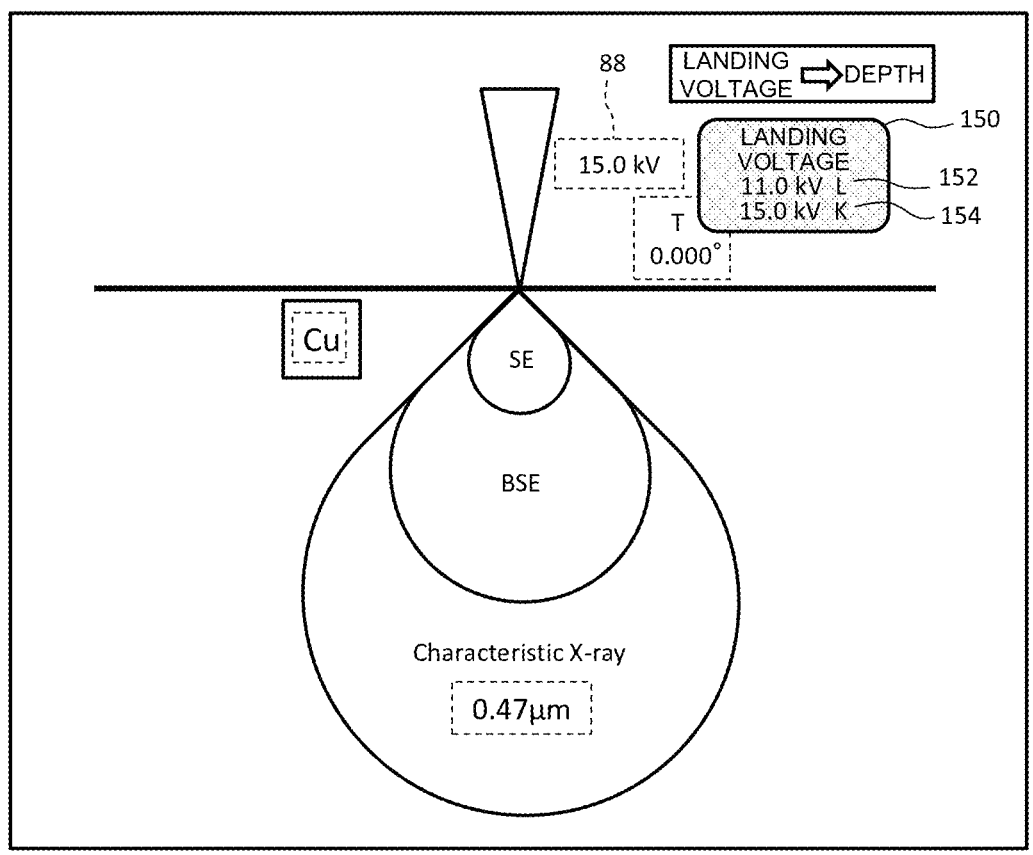
FIG. 10 is a diagram showing a pop-up window for displaying an accelerating voltage.

In FIG. 5, when the pointer 121 is moved to a position inside the box 88 (no click operation is necessary), a window 150 shown in FIG. 10 is automatically pop-up displayed. In FIG. 10, the window 150 includes numerical values 152 and 154 indicating two landing voltages corresponding to two characteristic X-rays. The numerical value 152 indicates the landing voltage corresponding to the generation depth of the L line, and the numerical value 154 indicates the landing voltage corresponding to the generation depth of the K line. With this configuration, for elements for which a plurality of characteristic X-rays are generated, it becomes possible to recognize the accelerating voltage to be designated when observation of a particular characteristic X-ray is desired. Although the reference image includes only the numerical value indicating one accelerating voltage, alternatively, a plurality of numerical values indicating a plurality of accelerating voltages may be displayed together in the reference image. According to the present embodiment, the content of the reference image can be simplified.

Figure 11:
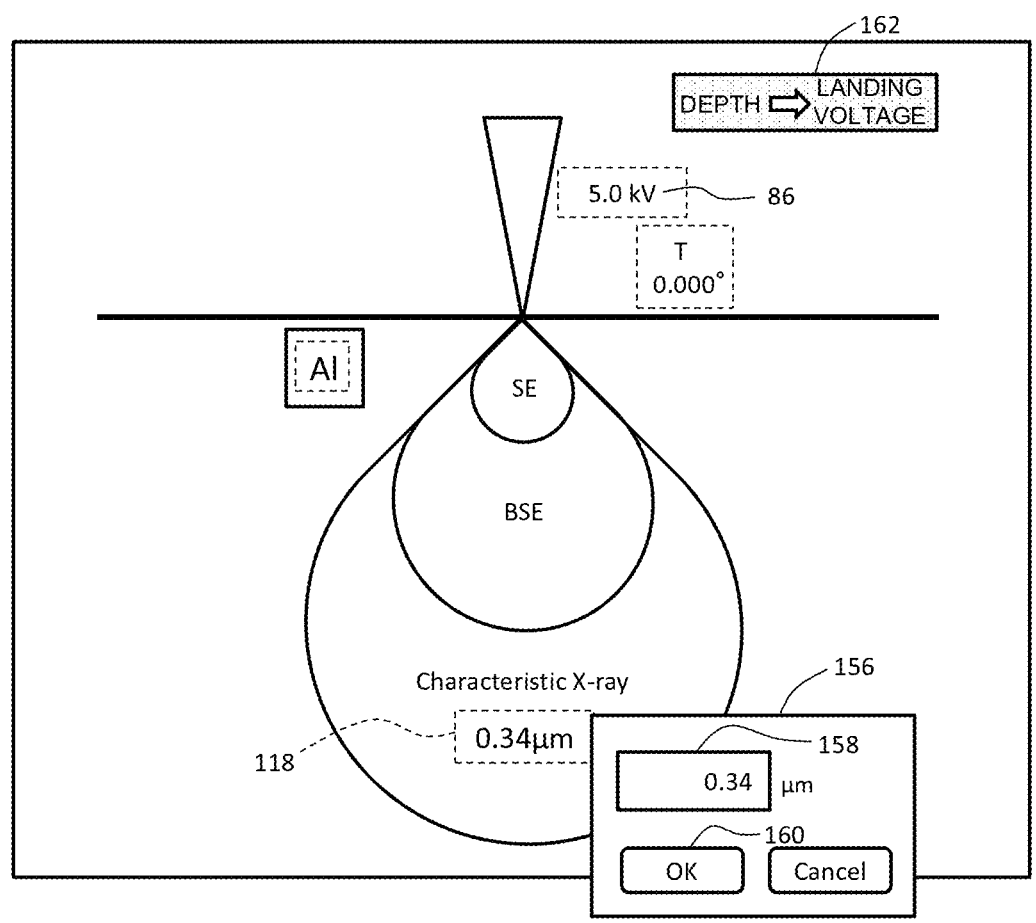
FIG. 11 is a diagram for explaining designation of a characteristic X-ray generation depth.

In FIG. 5, when the pointer 121 is moved to a position inside the box 118 and a click operation is performed in this state, a window 156 shown in FIG. 11 is pop-up displayed. In FIG. 11, the window 156 includes an input field 158 for the characteristic X-ray generation depth, an OK button 160, or the like. When the generation depth is directly input using the input field 158, and the OK button 160 is operated, an accelerating voltage corresponding to the generation depth is calculated, and the numerical value 86 is updated. In this case, a guidance display 162 is displayed. In this manner, the accelerating voltage can be back-calculated from the generation depth.

Figure 12:
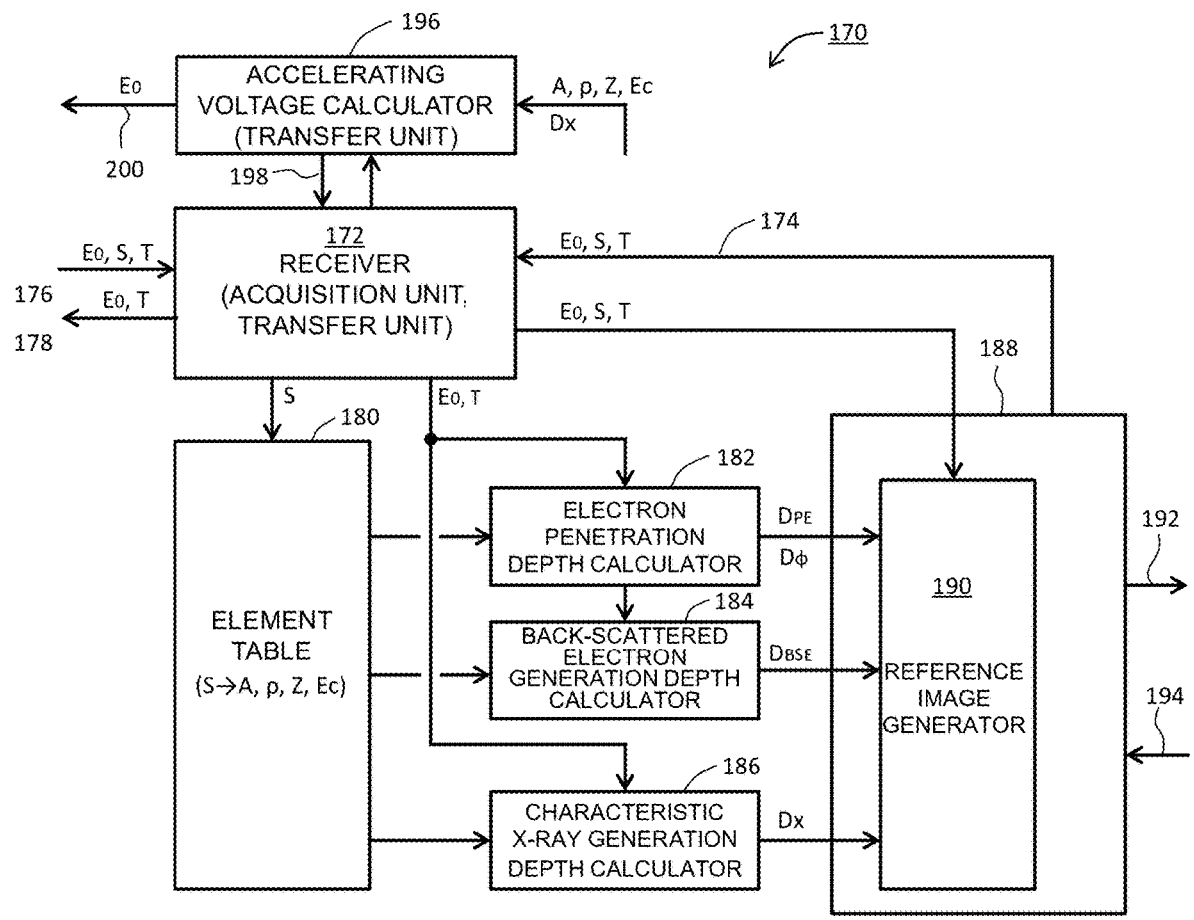
FIG. 12 is a diagram showing a UI unit in a second configuration.

Next, a second configuration of the UI unit will be described with reference to figures from FIG. 12 and on. A plurality of blocks shown in FIG. 12 show functions realized by software, except for an element table 180. A receiver 172 is a module which receives the accelerating voltage $E_0$, the element S, and the tilt angle T.

As shown by reference numeral 176, the receiver 172 functions as an acquisition unit which acquires from the controller the accelerating voltage $E_0$, and the tilt angle T, which are set in the controller, in response to an operation of the user. In addition, the receiver 172 functions as an acquisition unit which acquires from the analyzer information of the element S forming the specimen. When the specimen is formed from a plurality of elements, the concentrations of the elements may also be acquired. As shown by reference numerals 194 and 174, the receiver 172 has a function to receive the accelerating voltage $E_0$, the element S, or the tilt angle T which is input by the user through the GUI image.

The receiver 172 also functions as a transfer unit (application unit) which transfers, as the actual illumination condition, the received illumination condition to the controller, to apply the illumination condition; that is, to activate the illumination condition, in response to an operation of the user (refer to reference numeral 178). The illumination condition which is transferred is one or both of the accelerating voltage $E_0$ and the tilt angle T.

The information for specifying the element S which is received by the receiver 172 is supplied to the element table 180. The element table 180 forms an element database. When the information for specifying the element S is supplied to the element table 180, element information corresponding to the element S is output from the element table 180. The element information includes the mass A, the atomic number Z, the density ρ, and the minimum excitation energy Ec. The minimum excitation energy Ec corresponds to a minimum energy for generating the characteristic X-ray.

An electron penetration depth calculator 182 calculates an electron penetration depth $D_{PE}$ based on the accelerating voltage $E_0$, the tilt angle T, and the element information. A calculation formula for determining the electron penetration depth $D_{PE}$ will be described later. The electron penetration depth $D_{PE}$ is a size of an electron scattering range in the depth direction. The electron penetration depth calculator 182 also has a function to calculate a lateral width of the electron scattering range; that is, a width $D_0$ in a direction orthogonal to the depth axis. A calculation formula for determining the width $D_0$ of the electron scattering range will be described later.

In the present embodiment, a back-scattered electron generation depth calculator 184 calculates the back-scattered electron generation depth $D_{BSE}$ based on the electron penetration depth $D_{PE}$. If necessary, reference may be made to the element information for this calculation. A calculation formula for determining the back-scattered electron generation depth $D_{BSE}$ will be described later. A characteristic X-ray generation depth calculator 186 calculates the characteristic X-ray generation depth $D_X$ based on the accelerating voltage $E_0$, the tilt angle T, and the element information. A calculation formula for this calculation will be described later.

An image generator 188 is a module which generates the GUI image, and includes a reference image generator 190. To the reference image generator 190, there are supplied the electron penetration depth (depth of the electron scattering range) $D_{PE}$, the width of the electron scattering range $D_0$, the back-scattered electron generation depth $D_{BSE}$, the characteristic X-ray generation depth $D_X$, the accelerating voltage $E_0$, the element S, and the tilt angle T. Reference numeral 192 shows a signal which is output to the display. Reference numeral 194 shows a signal from the inputter.

An accelerating voltage calculator 196 is a module which back-calculates the accelerating voltage $E_0$ from the characteristic X-ray generation depth $D_X$ as necessary. For this back calculation, reference is made to the element information. The back-calculated accelerating voltage $E_0$ is sent to the receiver 172 (refer to reference numeral 198).

Calculation methods will now be described for the electron penetration depth $D_{PE}$, the width of the electron scattering range $D_0$, the back-scattered electron generation depth $D_{BSE}$, and the characteristic X-ray generation depth $D_X$.

First, it is assumed that the specimen is not inclined. The electron penetration depth $D_{PE}$ is calculated through the following Formula (1) which is known in the art.

[Formula 1]

$$D_{PE} = \frac{2.76 \times 10^{-11} A E_0^{5/3}}{\rho \cdot Z^{8/9}} \frac{\left(1 + 0.978 \times 10^{-6} E_0\right)^{5/3}}{\left(1 + 1.957 \times 10^{-6} E_0\right)^{4/3}} \quad (1)$$

In Formula (1) described above, A represents a mass of an atom, $E_0$ represents the accelerating voltage, p represents a density of the element, and Z represents an atomic number. Alternatively, the electron penetration depth $D_{PE}$ may be calculated by following Formula (2) which is known in the art.

[Formula 2]

$$D_{PE} = 0.033 \frac{A E_0^{1.7}}{\rho \cdot Z} \quad (2)$$

The mass A, the density p, and the atomic number Z are specified in the element table. The width of the electron scattering range $D_0$ is generally considered to be approximately equal to the electron penetration depth $D_{PE}$. The following Formula (3) shows this relationship.

[Formula 3]

$$D_\Phi = D_{PE} \quad (3)$$

The back-scattered electron generation depth $D_{BSE}$ is calculated by following Formula (4). Specifically, the back-scattered electron generation depth $D_{BSE}$ is calculated from the electron penetration depth $D_{PE}$, and as a half of the electron penetration depth $D_{PE}$.

[Formula 4]

$$D_{BSE} = \tfrac{1}{2} D_{PE} \quad (4)$$

The characteristic X-ray generation depth $D_X$ is calculated by the following Formula (5). In the following, Ec represents the minimum excitation energy for a particular electron orbital.

[Formula 5]

$$D_X = 0.033 \frac{A\left(E_0^{1.7} - E_C^{1.7}\right)}{\rho \cdot Z} \quad (5)$$

When the accelerating voltage $E_0$ is to be back-calculated from the characteristic X-ray generation depth $D_X$, the following Formula (6), which is another form of Formula (5), may be utilized.

[Formula 6]

$$E_0 = \left[\frac{D_X \cdot \frac{\rho Z}{A}}{0.033} + E_C^{1.7}\right]^{\frac{1}{1.7}} \quad (6)$$

On the other hand, when the specimen is inclined by the tilt angle T, a correction coefficient k defined by the following Formula (7) is used.

[Formula 7]

$$K = \tfrac{1}{2}(1 + \cos T) \quad (7)$$

More specifically, the electron penetration depth $D_{PE}$, the back-scattered electron generation depth $D_{BSE}$, and the characteristic X-ray generation depth $D_X$ are respectively multiplied by the correction coefficient k, to derive an electron penetration depth $D_{PE}'$, a scattered electron generation depth $D_{BSE}'$, and a characteristic X-ray generation depth $D_X'$ in the inclined state. When the following model is to be employed, the width of the electron scattering range $D_0$ does not depend on the inclination of the specimen.

Figure 13:
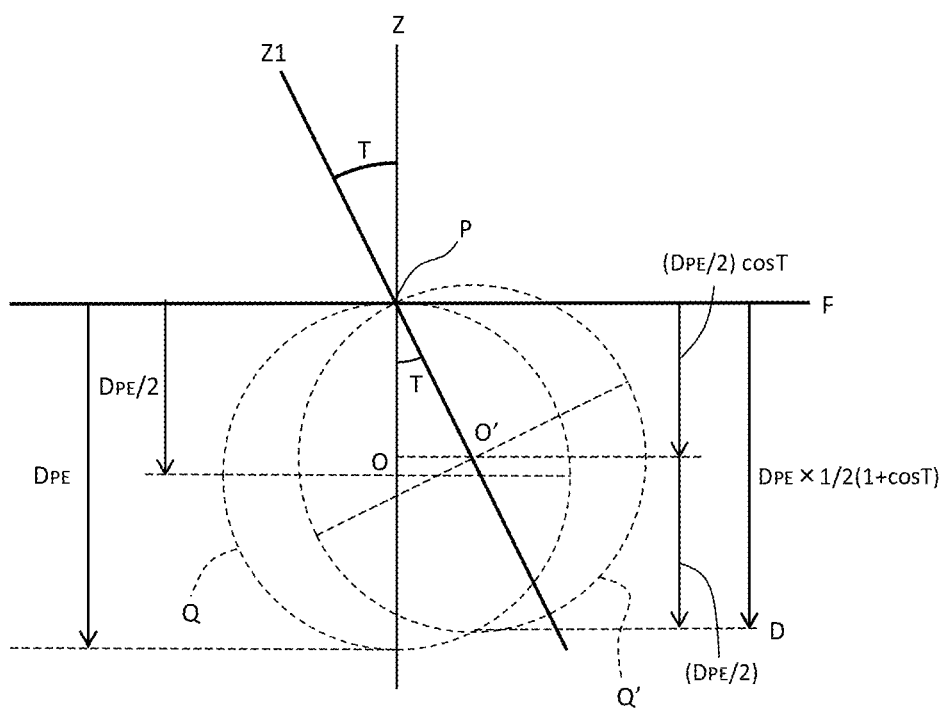
FIG. 13 is a diagram for explaining a definition of a depth.

Definition of the depth and the correction coefficient will now be described in detail with reference to FIG. 13. In FIG. 13, F represents a specimen surface. A Z axis corresponds to an electron beam before inclination. The electron penetration depth is shown by $D_{PE}$. The electron penetration depth $D_{PE}$ is a parameter defining a size of the electron scattering range in the specimen, and, in FIG. 13, the electron scattering range is shown by a circle (in reality, a sphere) Q. An origin of the range is shown by O. A distance from the specimen surface to the origin O (depth on the Z-axis) is $D_{PE}/2$.

The specimen is inclined with the tilt angle T. From another perspective, the electron beam is inclined relative to the specimen. The electron beam after the inclination is shown by Z1. In this manner, in FIG. 13, for the purpose of explanation, a position and an orientation of the specimen are fixed, and the electron beam is inclined. The electron scattering range after the inclination is shown by a circle Q'.

In the present embodiment, a definition is employed defining that a distance from the specimen surface in a direction orthogonal to the specimen surface is the depth. When this definition is employed, the depth of an origin O' of the electron scattering range after the inclination of the specimen is $(D_{PE}/2) \times \cos T$. A value obtained by adding a radius of the circle Q', $D_{PE}/2$, to the depth; that is, $D_{PE} \times \tfrac{1}{2}(1 + \cos T)$, is the electron penetration depth after the inclination of the specimen. A value obtained by removing $D_{PE}$ from this calculation formula is the correction coefficient k described above.

Because the definition is employed in which the distance from the specimen surface in a direction orthogonal to the specimen surface is the depth, with an increase in the tilt angle T, the electron penetration depth $D_{PE}$, the back-scattered electron generation depth $D_{BSE}$, and the characteristic X-ray generation depth $D_X$ are respectively reduced.

The calculation formula and the model described above are merely exemplary, and another calculation formula and another model may be used. In any case, by providing to the user a rough estimate approximately showing the shape and the size of the range of physical phenomena such as the electron scattering range, the back-scattered electron generation range, and the characteristic X-ray generation range, it becomes possible to reduce the burden of the user or to assist the setting of the illumination condition by the user, as compared to the case where none of these information is provided to the user.

Figure 14:
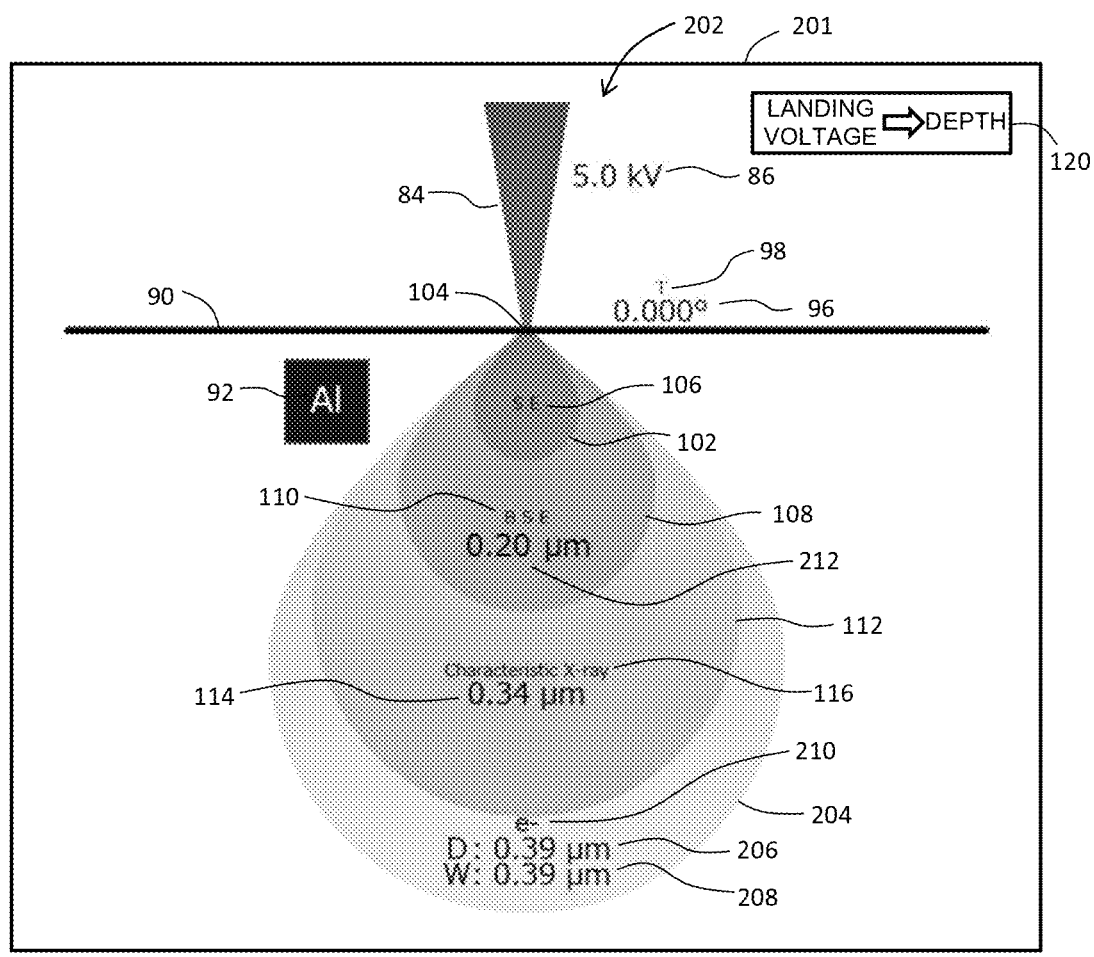
FIG. 14 is a diagram showing a reference image in the second configuration.

FIG. 14 shows a GUI image 201 generated and displayed in the second configuration. The GUI image includes a reference image 202 and a guidance display 120 of the second configuration. In FIG. 14, elements similar to those shown in FIG. 5 are assigned the same reference numerals.

The reference image 202 includes a plurality of figures or shapes 84, 90, 102, 108, 112, and 204, a plurality of numerical values 86, 96, 114, 206, 208, and 212, and a plurality of labels (text strings) 92, 98, 106, 110, 116, and 210. The reference image 202 corresponds to a vertical cross section of the specimen.

The figure or shape 84 has a downward-oriented pinnacle shape, and indicates the electron beam. The figure or shape 90 is a straight line simulating the specimen surface. An apex 104 of the figure or shape 84 comes in contact with the figure or shape 90. The apex 104 shows a point of illumination of the electron beam. The numerical value 86 indicates the accelerating voltage (landing voltage). The numerical value 96 indicates the tilt angle. The label 98 is a symbol showing the tilt angle.

The label 92 indicates the element forming the specimen. More specifically, the label 92 is an element symbol. When the specimen is formed from a plurality of elements, as described above, a primary element or a dominant element is selected. Alternatively, a configuration may be employed in which a plurality of elements can be designated. For example, a configuration may be employed in which a periodic table is displayed, and one or a plurality of elements are selected from the periodic table.

The figure or shape 102 has a liquid drop shape, and an apex thereof coincides with the apex 104. The figure or shape 102 simulates the secondary electron generation range. In the figure or shape 102, the label (SE) 106 indicating the secondary electrons is displayed. A size of the figure or shape 102 is constant regardless of the accelerating voltage or the like. Alternatively, the size may be changed according to the accelerating voltage or the like.

The figure or shape 108 has a liquid drop shape, and an apex thereof coincides with the apex 104. The figure or shape 108 simulates the back-scattered electron generation range. In the figure or shape 108, the label (BSE) 110 indicating the back-scattered electron is displayed. In addition, the numerical value 212 indicating the back-scattered electron generation depth is displayed. A size of the figure or shape 108 is constant regardless of the accelerating voltage or the like, but alternatively, similar to the above, the size may be changed according to the accelerating voltage or the like. The numerical value 212 changes with a change of the accelerating voltage, with a change of the element, or with a change of the tilt angle.

The figure or shape 112 has a liquid drop shape, and an apex thereof coincides with the apex 104. The figure or shape 112 simulates the characteristic X-ray generation range. In the figure or shape 112, the label (Characteristic X-ray) 116 indicating the characteristic X-ray is displayed. A size of the figure or shape 112 is also constant regardless of the accelerating voltage or the like. Alternatively, the size may be changed according to the accelerating voltage or the like. In the figure or shape 112, the numerical value 114 indicating the characteristic X-ray generation depth is displayed. The numerical value indicates a size (a width in the depth direction) of the generation range of the characteristic X-ray emitted from the specimen. The numerical value 114 changes with a change of the accelerating voltage, with a change of the element, or with a change of the tilt angle.

The figure or shape 204 has a liquid drop shape, and an apex thereof coincides with the apex 104. The figure or shape 204 simulates the electron scattering range, and in the figure or shape 204, the label 210 indicating the landing electron is displayed. A size of the figure or shape 204 is also constant regardless of the accelerating voltage or the like. Alternatively, the size may be changed according to the accelerating voltage or the like.

In the figure or shape 204, the numerical value 206 indicating a size (electron penetration depth) of the electron scattering range is displayed, and the numerical value 208 indicating the width of the electron scattering range is displayed. The numerical value 206 changes with a change of the accelerating voltage, with a change of the element, or with a change of the tilt angle. The numerical value 208 changes with a change of the accelerating voltage or with a change of the element, but does not change with a change of the tilt angle.

The guidance display 120 indicates that the characteristic X-ray generation depth is being calculated from the landing voltage; that is, the accelerating voltage.

A paint process is applied to the figures or shapes 102, 108, 112, and 204, and the figures are thus distinguished from each other. In overlapping regions of the figures or shapes 102, 108, 112, and 204, one of the figures (the figure with a smaller size) is displayed with a priority. As the shapes of the figures or shapes 102, 108, 112, and 204, a figure of a shape other than the liquid drop shape such as, for example, a circular shape, an elliptical shape, a vase shape, or the like, may alternatively be employed. When the size relationship is reversed between a plurality of ranges, such may be displayed or one or a plurality of figures may be deleted.

Figure 15:
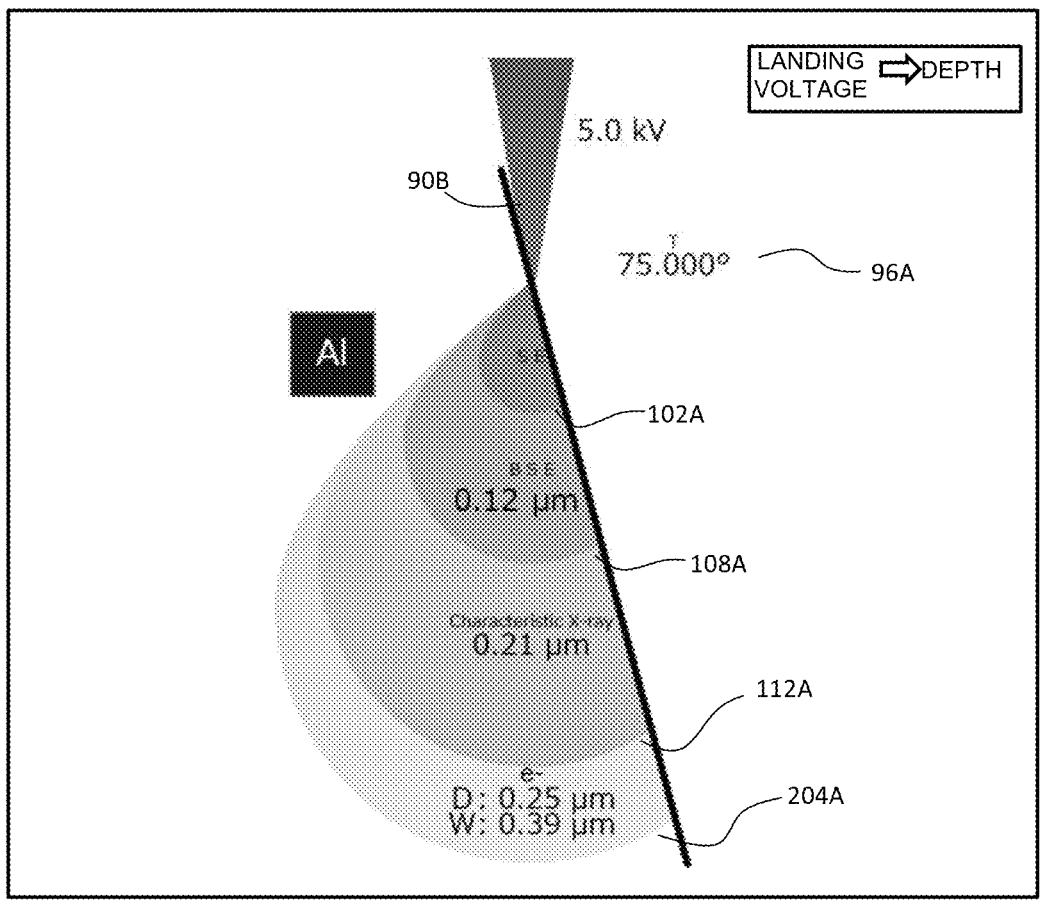
FIG. 15 is a diagram showing a reference image representing an inclined state.

FIG. 15 shows a reference image when the specimen is inclined. A numerical value 96A indicate the tilt angle. A figure or shape 90B showing the specimen surface is in an inclined state. In the plurality of original figures, portions protruding on the upper side in relation to the straight line is mask processed, and mask-processed figures or shapes 102A, 108A, 112A, and 204A are displayed. As described above, the plurality of depths shown as the plurality of numerical values are depths in the direction orthogonal to the specimen surface.

It is possible to change the accelerating voltage or the tilt angle while observing the reference image, and to consequently determine an optimum illumination condition in relation to the specimen. Then, the illumination condition may be actually applied, to execute the measurement of the specimen.

Figure 16:
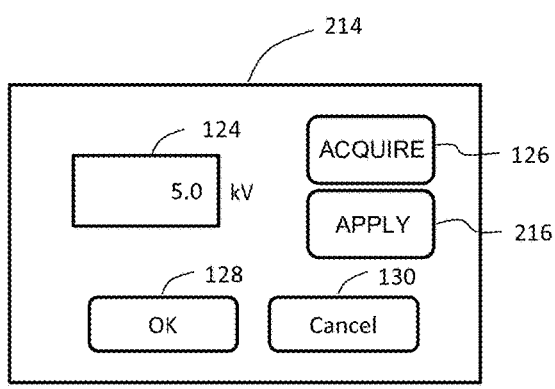
FIG. 16 is a diagram showing another pop-up window for setting the accelerating voltage.

When the second configuration is employed, on the GUI image, for example, when a box including the accelerating voltage is clicked, a window 214 shown in FIG. 16 may be pop-up displayed. The window 214 includes, in addition to the input field 124 for accelerating voltage, the acquisition button 126, the OK button 128, and the cancel button 130, an application button 216. When the application button 216 is operated, the accelerating voltage which is designated on the GUI image at that point is set as the actual accelerating voltage which is set in the controller.

Figure 17:
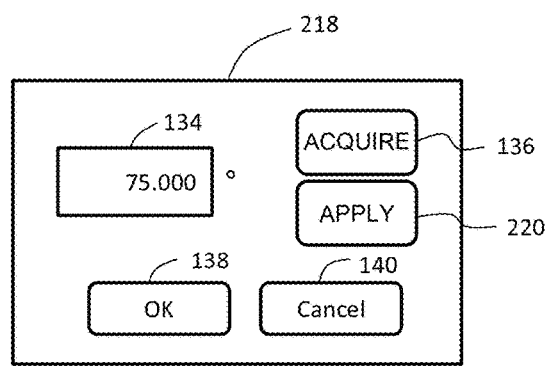
FIG. 17 is a diagram showing another pop-up window for setting the tilt angle.

When the second configuration is employed, on the GUI image, for example, when a box including the tilt angle is clicked, a window 218 shown in FIG. 17 may be pop-up displayed. The window 218 includes, in addition to the input field 134 for the tilt angle, the acquisition button 136, the OK button 138, and the cancel button 140, an application button 220. When the application button 220 is operated, the tilt angle which is designated on the GUI image at that point is set as the actual tilt angle which is set in the controller.

Figure 18:
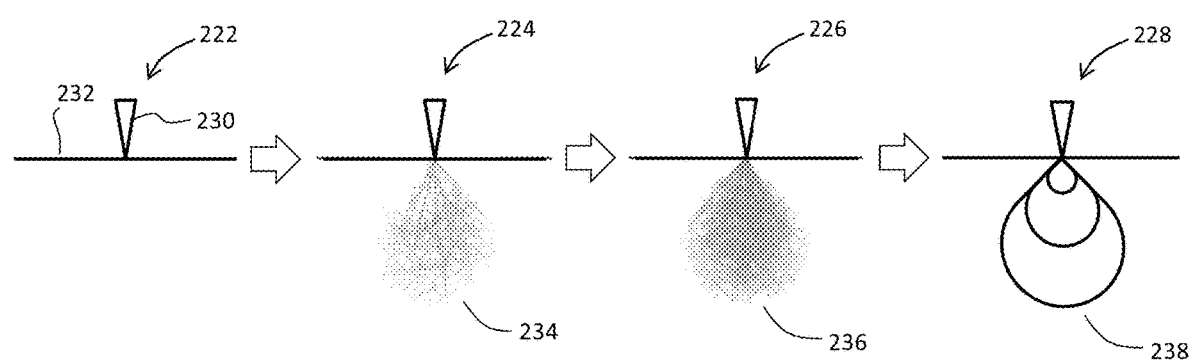
FIG. 18 is a diagram showing an animation display.

FIG. 18 exemplifies an animation display before the display of the reference image. A dynamic change of contents of the image is shown with a plurality of images 222-228. In reality, more images are displayed, but in FIG. 18, some representative images 222-228 are shown.

First, the image 222 is displayed. In the image 222, a line 232 indicating the specimen surface and a figure or shape 230 indicating the electron beam are displayed. Then, as shown by an image 224 and an image 226, images simulating the electron scattering in the specimen are displayed. Each of these images is formed from a plurality of straight lines. For example, as shown by reference numerals 234 and 236, straight lines may be randomly generated, and the number of the straight lines may be gradually increased, to generate an image simulating the electron scattering. For the image 222, display of such an image may be omitted.

An animated image showing the change of the electron scattering state may be formed by actually executing a Monte Carlo simulation or the like, but because such a process requires time, a simplified animation display is instead employed. Immediately after the animation display is completed, a reference image 238 is displayed. According to such a display, even for users with poor knowledge or little experience, it becomes easier to imagine the physical phenomenon which occurs during the measurement, and it becomes possible to visually assist the setting of the illumination condition. The reference image described above also may be utilized when the illumination condition which is already set is to be checked.

Figure 19:
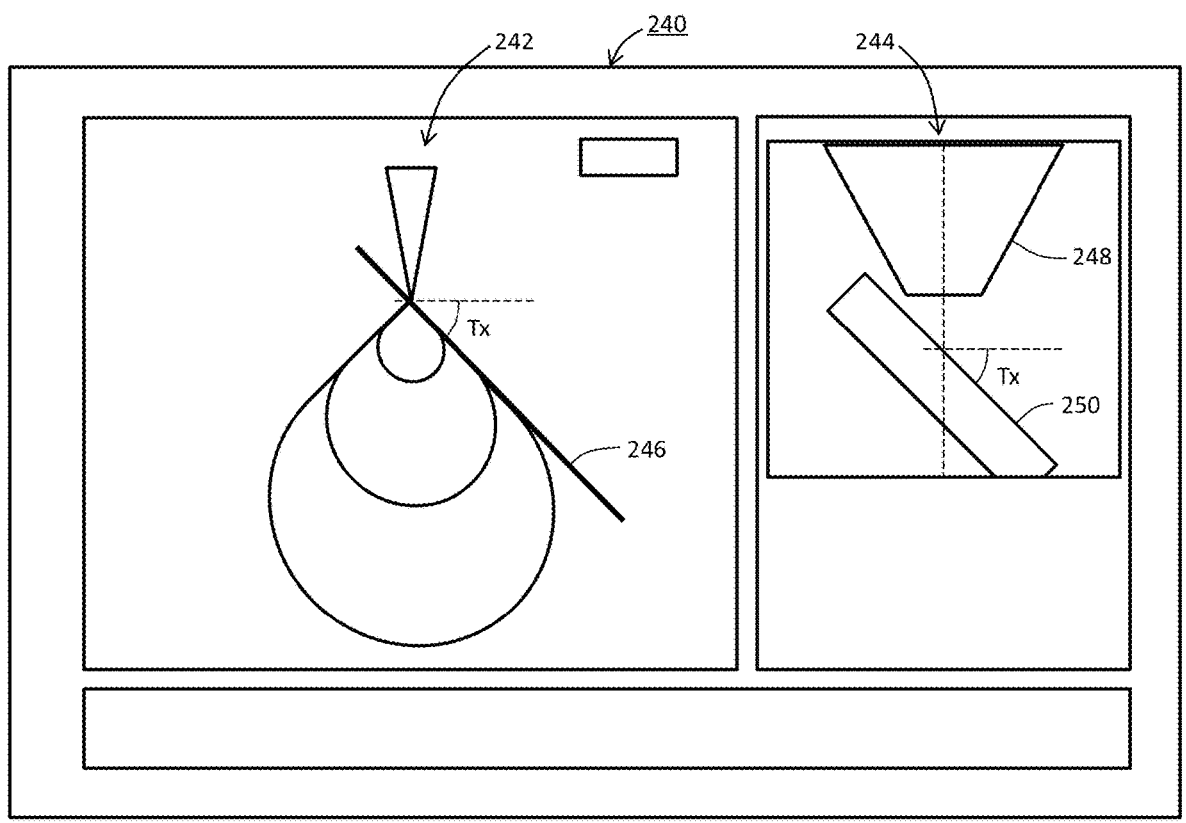
FIG. 19 is a diagram showing a parallel display of a plurality of reference images.

As shown in FIG. 19, a plurality of reference images 242 and 244 may be displayed simultaneously. The reference image 242 is a reference image showing the signal generation range and the electron scattering range. The reference image 244 is an image schematically showing the inside of the specimen chamber. More specifically, the reference image 244 is a CG image showing the specimen chamber, as viewed from a horizontal direction. The reference image 244 includes an object 248 indicating a lower end of the objective lens, and an object 250 indicating the specimen holder. The specimen is held by the specimen holder. The specimen holder is supported by the specimen stage, or is a part of the specimen stage.

When the inclination angle of the specimen is set in the controller, the specimen holder is inclined, and the object 250 is accordingly inclined. The inclination angle is shown by Tx. On the other hand, when Tx is designated as the inclination angle in the UI unit, or when the inclination angle Tx which is set in the controller is read to the UI unit, the reference image 242 is displayed. An inclination angle of a figure or shape 246 indicating the specimen surface is Tx. With a simultaneous observation of the two reference images 242 and 244, it becomes possible to imagine the physical phenomenon occurring inside the specimen while understanding the relationship between the electron beam and the specimen. Then, the illumination condition can be checked or changed.

As the image to be displayed along with the reference image 242, an image other than the reference image 244 may be displayed. For example, an image obtained by imaging an upper surface of the specimen holder may be displayed.

In the above-described embodiment, the scanning electron microscope has been described, but alternatively, the above-described structures may be applied to other charged particle beam apparatuses.

The invention claimed is:

1. A charged particle beam apparatus comprising:
   a measurement unit configured to illuminate a charged particle beam onto a specimen, and that detects a signal emitted from the specimen;
   a reference image generator configured to generate, before a measurement of the specimen by the measurement unit, a reference image including a figure simulating a signal generation range in the specimen and a numerical value indicating a size of the signal generation range, based on an illumination condition and specimen information for the generation of the reference image; and
   a display configured to display a graphical user interface image including the reference image when an actual illumination condition of the charged particle beam is set before the measurement of the specimen by the measurement unit.

2. The charged particle beam apparatus according to claim 1, further comprising:
   an acquisition unit configured to acquire, as the illumination condition for the generation of the reference image, an illumination condition which is already set for the measurement unit; and
   a receiver configured to receive, as the illumination condition for the generation of the reference image, an illumination condition which is input through the graphical user interface image.

3. The charged particle beam apparatus according to claim 1, further comprising:
   an application unit configured to apply, to the measurement unit, as the illumination condition for the generation of the reference image, an illumination condition which is input through the graphical user interface image.

4. The charged particle beam apparatus according to claim 1, wherein
   the illumination condition for the generation of the reference image includes an accelerating voltage, and
   the reference image changes with a change of the accelerating voltage.

5. The charged particle beam apparatus according to claim 1, wherein
   the illumination condition for the generation of the reference image includes a specimen inclination angle, and
   the reference image changes with a change of the specimen inclination angle.

6. The charged particle beam apparatus according to claim 1, wherein
   the specimen information for the generation of the reference image is element information, and
   the reference image changes with a change of the element information.

7. The charged particle beam apparatus according to claim 1, wherein
   the charged particle beam is an electron beam, and
   the reference image comprises the figure simulating a characteristic X-ray generation range as the signal generation range, and the numerical value indicating a size of the characteristic X-ray generation range.

8. The charged particle beam apparatus according to claim 1, wherein
   the reference image comprises the figure simulating a back-scattered electron generation range as the signal generation range, and the numerical value indicating a size of the back-scattered electron generation range.

9. The charged particle beam apparatus according to claim 1, wherein
the reference image comprises a figure simulating an electron scattering range in the specimen, and a numerical value indicating a size of the electron scattering range.

10. The charged particle beam apparatus according to claim 1, wherein
the reference image comprises a numerical value indicating the illumination condition for the generation of the reference image, and
the numerical value indicating the illumination condition for the generation of the reference image changes with a change of the numerical value indicating the size of the signal generation range.

11. A method of assisting setting, the method comprising:
generating a reference image including a figure simulating a range of a physical phenomenon in a specimen onto which an electron beam is illuminated and a numerical value indicating a size of the range of the physical phenomenon, based on an illumination condition and specimen information for the generation of the reference image;
displaying the reference image when a user sets an actual illumination condition of the electron beam; and
executing a measurement of the sample, after generating the reference image and displaying the reference image, by illuminating the electron beam onto the specimen and detecting the signal emitted from the specimen.

* * * * *